(12) United States Patent
Enquist

(10) Patent No.: US 6,410,943 B1
(45) Date of Patent: Jun. 25, 2002

(54) LIGHT EMITTING DEVICE CONTACT LAYERS HAVING SUBSTANTIALLY EQUAL SPREADING RESISTANCE AND METHOD OF MANUFACTURE

(75) Inventor: Paul M. Enquist, Research Triangle Park, NC (US)

(73) Assignee: Research Triangle Institute, Research Triangle Park, NC (US)

(*) Notice: Subject to any disclaimer, the term of this patent is extended or adjusted under 35 U.S.C. 154(b) by 0 days.

(21) Appl. No.: 09/423,612

(22) PCT Filed: May 14, 1998

(86) PCT No.: PCT/US98/09372

§ 371 (c)(1),
(2), (4) Date: Dec. 17, 1999

(87) PCT Pub. No.: WO98/52229

PCT Pub. Date: Nov. 19, 1998

Related U.S. Application Data

(60) Provisional application No. 60/046,437, filed on May 14, 1997.

(51) Int. Cl.[7] .............................................. H01L 33/00
(52) U.S. Cl. ........................... 257/97; 257/101; 438/37; 438/47; 372/45; 372/50
(58) Field of Search .............................. 257/94, 96, 97, 257/101; 372/45, 50; 438/32, 37, 47

(56) References Cited

U.S. PATENT DOCUMENTS

| 5,436,466 A |   | 7/1995 | Ko et al. |        |
|-------------|---|--------|-----------|--------|
| 5,442,203 A | * | 8/1995 | Adomi     | 257/98 |
| 5,481,122 A |   | 1/1996 | Jou et al.|        |
| 5,600,158 A |   | 2/1997 | Noto et al.|       |
| 5,631,475 A |   | 5/1997 | Watabe et al. |    |
| 5,670,798 A | * | 9/1997 | Schetzina | 257/101|
| 5,698,865 A |   | 12/1997| Gerner et al. |    |
| 5,804,834 A | * | 9/1998 | Shimoyama | 257/98 |

* cited by examiner

Primary Examiner—Jerome Jackson, Jr.
(74) Attorney, Agent, or Firm—Oblon, Spivak, McClelland, Maier & Neustadt, P.C.

(57) ABSTRACT

A light emitting device and method of fabricating a light emitting device. The device contains a light emitting junction, such as a pn junction. Contacts (11, 15) to the junction are designed to have substantially the same spreading resistance to produce a substantially uniform voltage across the light emitting junction. This will produce substantially light emission by the junction. The contacts can include contact layers (11, 15) whose spreading resistances are substantially matched by controlling the doping, thickness and/or composition of the layers.

36 Claims, 2 Drawing Sheets

LIGHT EMITTING DEVICE CONTACT LAYERS HAVING SUBSTANTIALLY EQUAL SPREADING RESISTANCE AND METHOD OF MANUFACTURE

CROSS-REFERENCE TO RELATED APPLICATIONS

This application claims the benefit of U.S. Provisional Application Ser. No. 60/046,437, filed May 14, 1997.

BACKGROUND OF THE INVENTION

1. Field of the Invention

The present invention relates to light emitting devices and, particularly, to LEDs and a method of manufacturing LEDs designed to having a uniform potential across the area of the light-emitting junction.

2. Discussion of the Background

There are a number of methods for the fabrication of discrete LEDs. Although the fabrication of LED arrays are constrained by issues related to the fabrication of discrete LEDs, there are additional constraints which must be considered when optimizing the fabrication of LED arrays.

For example, discrete LED arrays are typically fabricated on a conducting substrate since isolation between devices is not a concern because the devices will be separated as part of the packaging process. Conversely, LED arrays may require isolation between elements which is complicated by the use of a conducting substrate compared to the use of a semi-insulating substrate. Although a conducting substrate can be used, the fabrication is complicated and typically requires additional isolation and/or planarization to ensure that proper electrode isolation is achieved.

In addition, discrete LED fabrication typically uses a top contact near the center of the LED and a bottom contact around part or all of the periphery of the device. This approach minimizes issues associated with spreading resistance of the bottom contact due to the thickness of the conducting substrate but spreading resistance associated with the top contact can result in a non-uniform voltage at the pn junction resulting in LED brightness nonuniformity.

Since the pn junction is forward biased during operation, and the pn junction has an exponential current characteristic in the forward bias mode, a small difference in junction voltage significantly changes the operating current. According, the light emitted by the pn junction is nonuniform. Typically, this is manifested by a greater brightness nearer the top contact.

Solutions to the spreading resistance problem of the top contact have included the use of transparent contacts and additional process steps to minimize the spreading resistance between the top ohmic contact to the device and the pn junction. Thick epitaxial layers and/or semi-transparent contacts have been used. These solutions are not ideal since 1) transparent contacts typically exhibit some spreading resistance and these transparent contacts are not as transparent as no contact at all and 2) the growth of thick epilayers adds additional cost and complexity to the process and results in a thick device. For example, currently a high brightness LED is being manufactured having a very thick layer of GaAsP on top of the LED, but the device (epitaxial layers) is about 10 μm thick.

SUMMARY OF THE INVENTION

It is an object of the present invention to provide an LED and a method of manufacturing an LED where the spreading resistance in the upper and lower layers of the LED structure is matched to obtain a uniform voltage across the pn junction of the LED structure.

Another object of the present invention is to minimize the spreading resistance in the upper and lower layers of a LED structure to simplify the matching of spreading resistance and achievement of a uniform voltage across the pn junction of the LED structure.

Yet another object of the present invention is to allow light emitting devices to be fabricated on a semi-insulating substrate to simply the fabrication process.

A further object of the present invention is to reduce the absorption (bandgap and free carrier) in the top layer of an LED structure while matching the spreading resistance in the upper and lower layers of the LED structure.

A still further object of the present invention is to minimize the thickness of an LED structure while matching the spreading resistance of the upper and lower layers of a LED structure to simplify planarization in the fabrication of LEDs and LED arrays.

These and other objects of the present invention are achieved by a light emitting device where contacts are made to the light emitting junction. The spreading resistances of the contacts are substantially equal, resulting in a substantially uniform voltage across the light emitting junction and substantially uniform light emission by the junction. The spreading resistance can be substantially matched by controlling the composition, doping and/or layer thicknesses of the contact layers.

The junction can be a pn junction having a p-type active layer and an n-type clad layer. The contact to the active layer may include a clad/grad layer or layers and a p contact layer, while the contact to the n clad layer may include an n-type grade layer and an n-type contact layer.

The layers through which light is emitted should be made transparent. This may be accomplished by making these layers thin, controlling their composition, or selectively removing portions of these layers in the light emitting area. When the layers are selectively removed, the spreading resistance matching can be accomplished with the remaining layers and/or layer portions.

The above and other objects of the invention may also be achieved with a method of fabricating light emitting devices where contacts to a light emitting element are formed have substantially the same spreading resistance. By forming the spreading resistances of the contacts to be substantially equal, a substantially uniform voltage across the light emitting element is produced, resulting in substantially uniform light emission by the element. The spreading resistance can be substantially matched by controlling the composition, doping and/or layer thicknesses of the contact layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
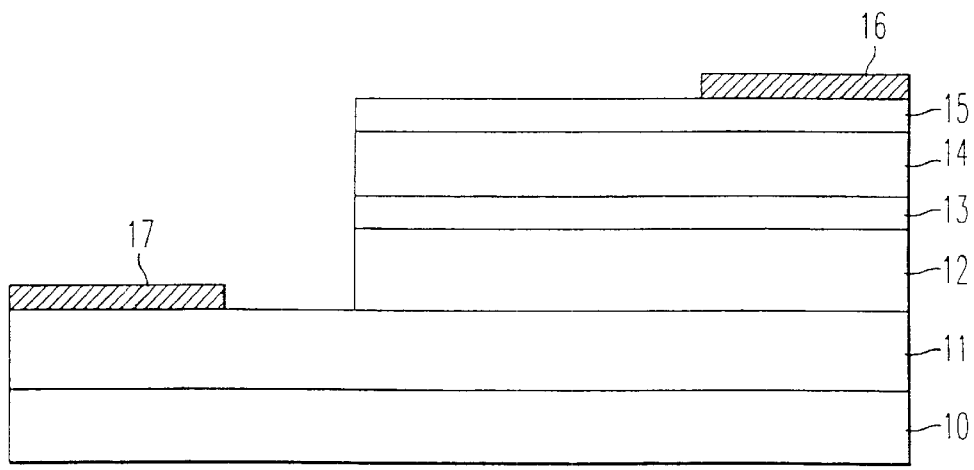
FIG. 1 is a diagram of an LED according to a first embodiment of the present invention.

Referring now to the drawings, particularly to FIG. 1, where like reference numerals designate corresponding parts throughout the views, a first embodiment of the invention will be described. FIG. 1 is a schematic diagram of an LED structure in cross section, and is not to scale but is drawn to illustrate the invention. Reference numeral 10 represents a substrate, preferably semi-insulating but n+ and p+ substrates may also be used. Disposed on substrate 10 is a p-contact layer 11. Layer 11 is preferably doped to or near the saturation point to minimize its resistivity. Layer 11 is also of reduced bandgap to improve contact resistance.

Disposed on layer 11 is a p-clad/grade layer 12, and disposed on layer 12 is an active p-layer 13. The bandgap of layer 13 is selected based upon the wavelength of light desired to be emitted. Layer 12 has a higher bandgap than that of layer 13 to obtain confinement of carriers electrically injected into active layer 13 to improve radiative recombination efficiency. The grade portion of layer 12 is between the clad portion and contact layer 11 to reduce resistance. Layer 12 may also consist of two layers, a clad layer and a grade layer. Also, the bandgap of layer 11 may also be below that of layer 13 and hence adsorptive to photons emitted from the active layer.

Disposed over layer 13 are an n clad/grade layer 14 and an n contact layer 15. Similar to layer 12, layer 14 has a higher bandgap than that of layer 13 to obtain confinement of carriers electrically injected to active layer 13 to improve the radiative recombination efficiency. Layer 14 may also be formed of two layers, a clad layer and grade layer between the clad layer and the active layer 13. Layer 15 is also of reduced bandgap to improve contact resistance and may have a bandgap below that of layer 13 and hence adsorptive to photons emitted from the active layer. Layer 15 is preferably made as thin as possible.

Lastly, a metal contact 16 is disposed on layer 15. The contact is located a desired distance away from the edge of the stack of layers 12–15 to provide a desired amount of junction area of the LED. This distance is approximately 15 $\mu$m for a typical LED.

In the LED example of FIG. 1, the pn junction is between p active layer 13 and n clad/grade layer(s) 14. There is a spreading resistance between the contact on the n contact layer and the pn junction and the p contact on the p contact layer and the pn junction. In a conventional device on a p+ (or n+ substrate) where the contact is on the backside of the substrate, there is essentially no spreading resistance since the contact is directly underneath the junction. This results in a varying resistance between the two contacts which produces a nonuniform junction voltage and nonuniform light emitting characteristics, as discussed above.

In the present invention, the combined p contact layer 11 and p clad layer 12 are designed to have the same spreading resistance as the combined n contact layer 15 and n clad/grade layer 14 so that the junction voltage will be uniform, or substantially uniform, across the junction. The spreading resistance may be determined primarily by either of the combined p or n layers (layers 11 or 12, 14 or 15). In this case the other layer could be either thin or lightly doped, or both. Furthermore, the layout of the device is one-dimensional as opposed to radial as is typically done in conventional devices so that the spreading resistances can be more ideally matched.

The sheet resistances of the combined p contact layer 11 and p clad layer 12 and the combined n contact layer 15 and n clad/grade layer 14 may be matched by controlling the composition, doping and/or thicknesses of the layers. In the first embodiment, n-type material on top of the device and p-type material underneath the device are utilized since the sheet resistance of n-type material for a given thickness near doping saturation is significantly lower than for p-type material due to a much higher mobility typically found in the n-type material. This results in a spreading resistivity match for thinner layer on top where photons are emitted than if the n-type material was on bottom. The use of thinner layers on the top results in significantly less absorption of emitted photons since the contact layers are typically of smaller bandgap than the active layer. Moreover, this reduced resistivity for the n-type material is achieved at a lower doping density which results in less free carrier absorption since free carrier absorption is less for n-type material than p-type material and the free carrier absorption increases with doping density.

Alternatively, the use of n-type material on top allows the spreading resistance to be reduced for a given tolerable absorption of photons emitted from the active layer. This lower spreading resistance makes it significantly easier to match the spreading resistance and achieve a uniform junction voltage since a variation in junction voltage is determined primarily by the difference in sheet resistance which causes the spreading resistance. The current passing through the forward biased junction voltage is exponentially dependent on this voltage so a small difference in spreading resistance can cause a large variation in current across the junction and hence variation in areal brightness from the LED. Table 1 below provides estimates of the ratio of current variation across a square of material due to a variation in difference in sheet resistance between the upper and lower layers assuming the junction current is exponentially related to the junction voltage and the junction voltage is simply determined by a linear IR drop from the contact. For actual devices the difference values may not be as extreme, based upon actual device design and other considerations including current flow across the junction.

TABLE 1

| Difference in combined layer Sheet Resistance in Ohms/Square at 10 mA | Ratio of Current Change Across Junction |
| --- | --- |
| 100 | $6 \times 10^{16}$ |
| 50 | $2 \times 10^{8}$ |
| 10 | 48 |
| 5 | 7 |
| 1 | 1.5 |

So, for example, the sheet resistance difference between the top contact and the junction and the bottom contact and the junction must be maintained within or on the order of 1 ohm/square in order to maintain the current uniformity within a factor of 1.5 across a square of material, given the above assumptions. In actual devices sheet resistance difference may be maintained within 1–10 ohms/square in order to maintain currant uniformity sufficient for practical applications. For example, a square of material would be a lateral separation between top and bottom contacts of about 15 microns for a contact which was 15 microns long (into the page) in FIG. 1.

A more specific example of the first embodiment, an AlGaAs structure, using a semi-insulating substrate with p-type material on the bottom and n-type material on the top, will now be described. Table 2 below gives the doping concentrations and layer thickness of the AlGaAs structure.

It is estimated that a sheet resistance on the order of 15 ohms/square can be obtained in the n contact/n clad/n grade layers 14–15 and p contact layer 11 and p clad layer 12 with a structure described in Table 2. Note that this structure is designed to give a nominal emission wavelength of 650 nm.

TABLE 2

| Layer | Thickness (nm) | Doping (cm-3) | Al composition (%) |
| --- | --- | --- | --- |
| n contact | 0.3 | $5 \times 10^{18}$ | 0.0 |
| n grade | 0.1 | $2 \times 10^{18}$ | 0.7–0.0 |
| n clad | 0.5 | $2 \times 10^{18}$ | 0.7 |
| p active | 0.2 | $2 \times 10^{17}$ | 0.38–0.39 |
| p clad | 0.3 | $2 \times 10^{19}$ | 0.7 |
| p grade | 0.1 | $5 \times 10^{19}$ | 0.0–0.7 |
| p contact | 0.5 | $1 \times 10^{20}$ | 0.0 |

Although the spreading resistance of the top and bottom layers in the AlGaAs example is likely to be higher than that achieved in prior art LED structures, the sheet resistance of 15 ohms/square is considered to be quite acceptable given that a $^-$10 percent control of sheet resistance is considered achievable in production and expected to allow the current uniformity due to junction voltage variation to be within a factor of two. This is a considerable improvement over using a p+ substrate and a combined 15 ohms/square n sheet resistance since this would essentially yield a difference in combined sheet resistance of 15 ohms/square and a resulting currently nonuniformity as high as approximately 50 (from TABLE 1). Furthermore, the AlGaAs structure is only $^-$2 microns in total height which simplifies processing and reduces cost when fabricating arrays of LEDs, versus typical discrete LEDs which may be over 10 μm total height.

While the first embodiment is an n over p structure, the present invention is not so limited. The invention is equally applicable to a p over n structure. The invention is also applicable to many types of semiconductor materials, such as GaAsP, GaInP, AlGaInP, GaInAs, InP and GaN or other combinations of III/V materials.

The structure of the first embodiment can be varied to achieved further improved results. For example, an additional improvement of the structure is to further thin n contact layer 15 and to thicken and increase the doping of the n clad region 14 to reduce bandedge absorption by layer 15. In the AlGaAs structure, the n contact may be thinned to $^-$0.1 μm or less for high doping concentration.

It is desirable to minimize the absorption in the region above an active layer between the metal contacts where light is emitted. For the structure of FIG. 1, this corresponds to layers 14 and 15 (or layer 11 for a p over n structure). This can be accomplished in a number of ways. For example, in a second embodiment of the present invention shown in FIG. 2, the n contact layer 15 and the n grade layer 14B have been removed in the main portion of light emitting area. Note in FIG. 2 that separate clad and grade layers 12A, 12B, 14A and 14B are illustrated. The matching of the spreading resistance is accomplished with the n clad layer 14A and the p contact layer 11 and p clad/grade 12A and 12B.

In layer 14, only part of the grade composition will be adsorbent to the emitted light. Thus, it is possible to eliminate only the adsorbent part of the grade layer. In a modification of the second embodiment, shown in FIG. 3, n grade layer 14B has been etched to leave that portion 18 that does not absorb, or does not appreciably absorb (to a desired level), emitted light. In the more specific example of TABLE 2, this corresponds to etching that portion of the n AlGaAs grade layer having an Al composition comparable or less than the active region, i.e., 0.38–0.39. A desired thickness of the layer may be removed by etching for a determined amount of time, knowing the etching characteristics and thickness of the grade layer.

Figure 4:
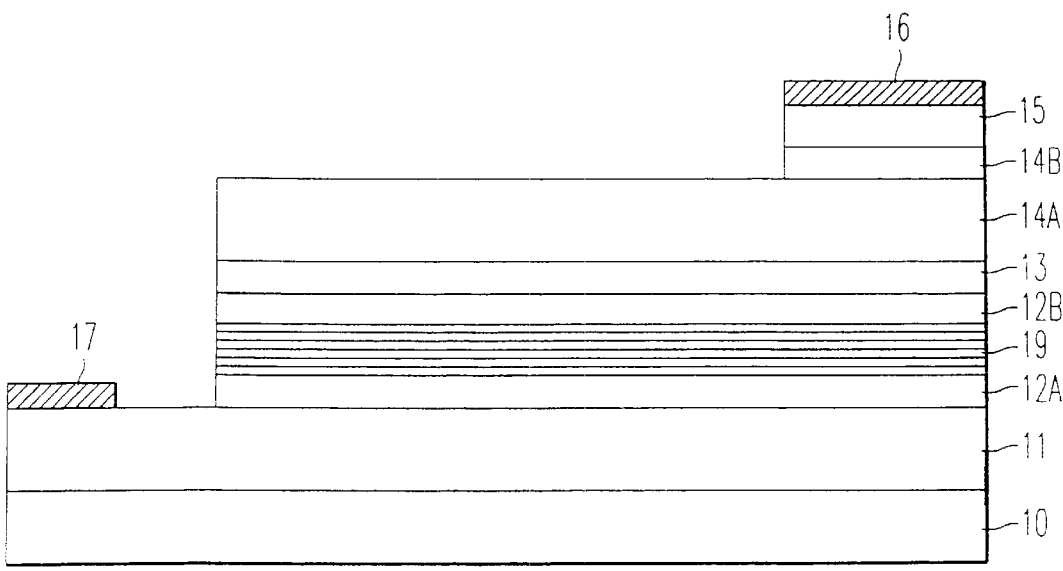
FIG. 4 is a diagram of an LED according to a third embodiment of the present invention.

Minimizing light adsorption can also be accomplished as shown in FIG. 4, a third embodiment of the device according to the invention. Here, p clad layer includes a ¼ wavelength stack 19. Stack 19 may be implemented, for example in the device described in TABLE 2, as layers of alternating Al composition such that the composition of all the layers of the stack is greater than active layer 13, so that there is negligible adsorption, and that there is sufficient difference in Al composition between the alternating layers to achieve reflection of light generated in the active region and propagating toward the substrate. For example, a sufficient difference is in the range of 50–90 per cent.

While the fourth embodiment shows etched layers 14B and 15, corresponding to the second embodiment (FIG. 2), the inclusion of layer 19 is not so limited. Layer 19 may be used in the other embodiments of the invention.

The method of fabricating light emitting devices according to the invention may be carried out using conventional growth or deposition (MBE, CVD or MOCVD, for example), photolithography, implantation, etching and metallization steps. For example, in first embodiment of the method according to the invention, the device shown in FIG. 1 may be fabricated by growing or depositing layers 11–15 on substrate 10. A mask can then be formed on layer 15 using photolithography and used to etch layers 12–15 to expose layer 11 for contact formation. The mask is removed followed by the forming of contacts 16 and 17. Appropriate annealing steps, or other steps, may be included as needed or as desired to achieve particular device characteristics.

Figure 2:
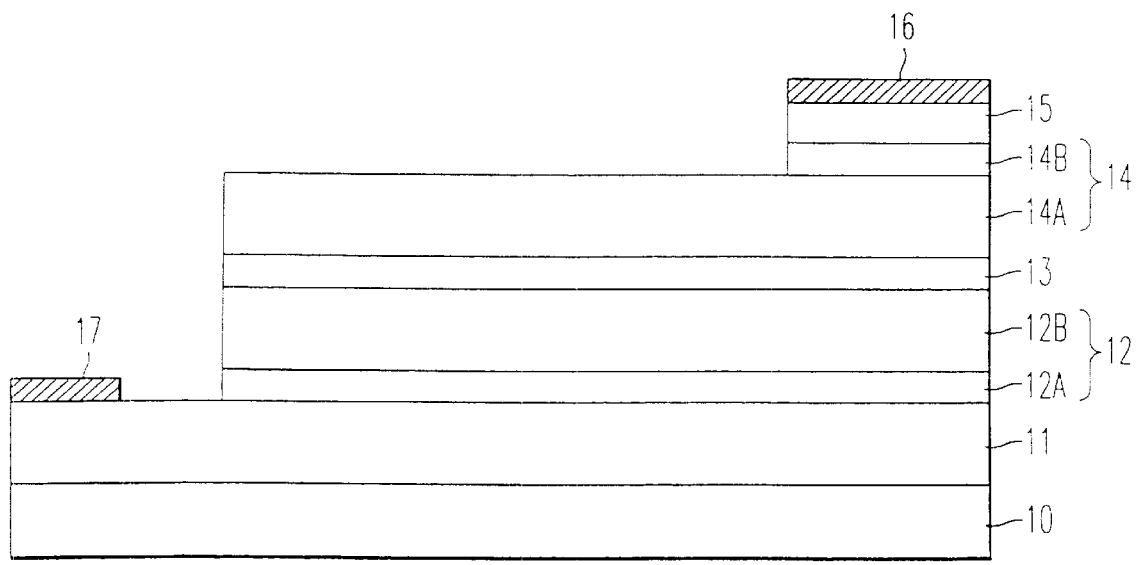
FIG. 2 is a diagram of an LED according to a second embodiment of the present invention.
Figure 3:
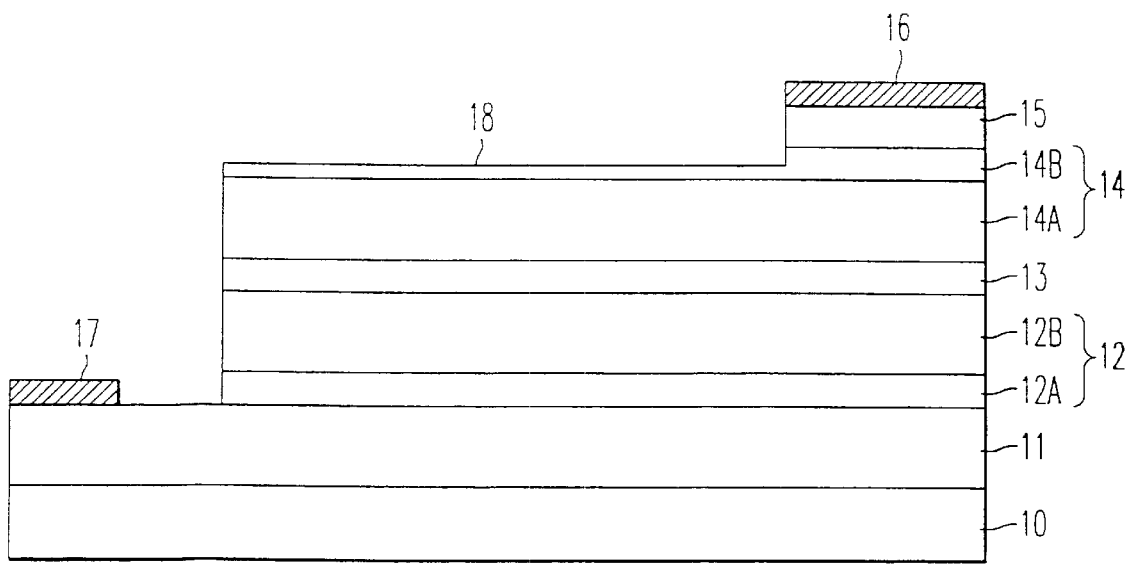
FIG. 3 is a diagram of an LED according to a modification of the second embodiment of the present invention.

In a second embodiment of the method according to the invention, used to fabricate the devices of FIGS. 2 and 3, the processing is the same up to the contact formation. Here, another mask may be formed on layers 11 and 15 to facilitate the etching of layers 15 and 14B. Layer 14B may be completely (FIG. 2) or partially removed (FIG. 3). Contacts 16 and 17 may then be formed. Alternatively, contact 16 may be used as a mask, coupled with some type of masking of contact 17 and layer 11 to avoid etching layer 11.

In a third embodiment of the method according to the invention, either the first or second embodiments may be modified to include the growing or depositing of a ¼ wavelength stack between layers 12A and 12B, such as by growing or depositing alternating layers of different Al composition.

In each of the embodiments of the method, the spreading resistance matching is achieved by selecting the growth parameters such as gas composition, growth times, growth or deposition method, or doping method, to produce a layer of the desired doping concentration and thickness. The layers are typically formed epitaxially to achieve uniform characteristics, such as doping and thickness, to produce uniform spreading resistance values.

Obviously, numerous modifications and variations of the present invention are possible in light of the above teachings. It is therefore to be understood that within the scope of the appended claims, the invention may be practiced otherwise than as specifically described herein. For example, the invention is not limited to LED devices or fabricating LED devices. The invention is applicable to any light emitting device where brightness may be limited or affected by spreading resistance. One such device is a laser.

What is claimed is:

1. A light emitting device, comprising:

a light emitting region;

a first contact to said region comprising a first semiconductor material having a first non-negligible spreading resistance; and a second contact to said region, opposing said first contact, comprising a second semiconductor material having a second spreading resistance substantially equal to said first spreading resistance.

2. A device as recited in claim 1, wherein said light emitting region comprises a pn junction;

said first contact comprises at least one layer connected to one of p and n regions of said junction; and said second contact comprises at least one layer connected to the other of said p and n regions of said junction.

3. A device as recited in claim 2, wherein at least one of said first and said second contacts comprises at least one of a contact, clad and grade layers.

4. A device as recited in claim 2, wherein said second contact comprises:

a clad layer disposed over a light emitting portion of said device; and at least one of a grade layer portion and a contact layer portion disposed over only a desired portion of said grade layer.

5. A device as recited in claim 4, wherein said grade layer is comprised of a material that substantially does not absorb light emitted from said region.

6. A device as recited in claim 2, wherein said second contact comprises:

a clad layer disposed over said region;

a grade layer disposed over said clad layer and over a light emitting portion of said device; and a contact layer portion disposed over only a desired portion of said grade layer.

7. A device as recited in claim 2, further comprising:

a ¼ wavelength layer disposed in one said first and second contacts.

8. A device as recited in claim 2, further comprising a semi-insulating substrate, wherein:

said first contact comprises:

a p-type contact layer, a p-type grade layer disposed on said p-type contact layer, and a p-type clad layer disposed on said p-type grade layer; and said second contact layer comprises:

an n type clad layer disposed on a p-type active layer, an n type grade layer disposed on said n type clad layer, and an n type contact layer disposed on said n type grade layer.

9. A device as recited in claim 1, wherein said first spreading resistance is within approximately a range of 1–10 $\Omega$/square of said second spreading resistance.

10. A device as recited in claim 9, wherein one of said first and second spreading resistances is in the range of approximately 2–50 $\Omega$/square.

11. A device as recited in claim 1, wherein:

said region comprises a p-type active layer;

said first contact comprises a p-type contact layer and a p-type grade/clad layer disposed between said p-type contact layer and said active layer; and said second contact comprises a n-type contact layer and an n-type grade/clad layer disposed between said n-type contact layer and said active layer.

12. A device as recited in claim 11, wherein:

said active layer comprises an AlGaAs layer having a doping of approximately $2 \times 10^{18}$/cm$^3$ and an Al composition of approximately 0.38–0.39 percent;

said p-type grade/clad layer comprises an AlGaAs layer having a doping of approximately $5 \times 10^{19}$/cm$^3$ and an Al composition of approximately 0–0.7 percent and an AlGaAs layer having a doping of approximately $2 \times 10^{19}$/cm$^3$ and an Al composition of approximately 0.7 percent;

said p-type contact layer comprises an GaAs layer having a doping of approximately $1 \times 10^{20}$/cm$^3$;

said n-type grade/clad layer comprises an AlGaAs layer having a doping of approximately $2 \times 10^{18}$/cm$^3$ and an Al composition of approximately 0–0.7 percent and an AlGaAs layer having a doping of approximately $2 \times 10^{18}$/cm$^3$ and an Al composition of approximately 0.7 percent; and said n-type contact layer comprises an GaAs layer having a doping of approximately $5 \times 10^{18}$/cm$^3$.

13. A light emitting device, comprising:

a light emitting junction; and first and second contacts to said light emitting junction comprising respective first and second semiconductor material having substantially the same nonzero spreading resistance to provide a substantially uniform voltage difference across a predetermined portion of said junction.

14. A device as recited in claim 11, wherein one of said contacts has a spreading resistance within approximately a range of 1–10 $\Omega$/square of that of the other contact.

15. A device as recited in claim 12, wherein one of said contacts has a spreading resistance in the range of approximately 2–50 $\Omega$/square.

16. A method of fabricating a light emitting device, comprising:

forming a light emitting region;

forming a first contact to said light emitting region comprising a first semiconductor material having a first non-negligible spreading resistance; and forming a second contact, opposing said first contact, to said light emitting region comprising a second semiconductor material having a second spreading resistance approximately equal to said first spreading resistance.

17. A method as recited in claim 16, wherein:

forming said region comprises forming an active layer;

forming said first contact comprises forming a first grade/clad layer connected to said active layer and forming a first contact layer on said first grade/clad layer; and forming said second contact comprises forming a second grade/clad layer connected to said active layer and forming a second contact layer on said second grade/clad layer.

18. A method as recited in claim 17, comprising:

forming said first contact layer and said first grade/clad layer to have said first spreading resistance; and forming said second grade/clad layer and said second contact layer to have said second spreading resistance.

19. A method as recited in claim 17, comprising:

forming said first grade/clad layer over said active layer;

forming said first contact layer over said first grade/clad layer;

removing a portion of said first contact layer in a light emitting area of said device; and removing at least a portion of said first grade/clad layer in said area.

20. A method as recited in claim 19, comprising:

forming said second contact layer and said second grade/clad layer to have said second spreading resistance; and forming a remaining portion of first grade/clad layer after said step of removing at least a portion and a remaining portion of said first contact layer to have said first spreading resistance.

21. A method as recited in claim 19, wherein said removing at least a portion step removes substantially that portion of said first grade/clad layer adsorbent to light emitted by said device.

22. A method as recited in claim 19, comprising:

forming said active layer and said first grade/clad layer using compound semiconductor materials; and removing substantially said portion of said first grade/clad layer having a composition absorbent to light emitted by said device.

23. A method as recited in claim 17, comprising:

forming said active layer using a compound semiconductor material having a first bandgap; and forming said first and second grade/clad layers using a compound semiconductor material having a second bandgap greater than said first bandgap.

24. A method as recited in claim 17, wherein forming said first and second contact comprises controlling at least one of doping, composition and thickness of at least one layer in one of said first and second contacts to make said first and second spreading resistances substantially equal.

25. A method as recited in claim 16, wherein forming said first contact includes forming a ¼ wavelength stack.

26. A method as recited in claim 16, comprising:

forming said first and second spreading resistances to be approximately in the range of 2–50 Ω/square.

27. A method as recited in claim 16, comprising:

matching said first and second spreading resistances within a range of approximately 1–10 Ω/square.

28. A method of fabricating a light emitting device, comprising:

forming a light emitting junction; and forming contacts to said junction each comprising a semiconductor material such that a substantially uniform voltage is applied across said junction by substantially matching spreading resistances of said contacts.

29. A method as recited in claim 28, comprising:

forming spreading resistances to be in a range of approximately 2–50 Ω/square.

30. A method as recited in claim 28, comprising:

matching said spreading resistances within a range of approximately 1–10 Ω/square.

31. A method as recited in claim 28, wherein:

each of said contacts comprises at least one layer of material; and said matching comprises controlling at least one of doping, composition and thickness of a material of a layer in at least one of said contacts.

32. A method as recited in claim 31, wherein:

said matching comprises controlling at least one of doping, composition and thickness of a material of a layer in each of said contacts.

33. A light emitting device, comprising:

a light emitting region;

a first contact to said region having a first non-negligible spreading resistance; and a second contact to said region, opposing said first contact, having a second spreading resistance substantially equal to said first spreading resistance, wherein said first spreading resistance is within approximately a range of 1–10 Ω/square of said second spreading resistance.

34. A light emitting device, comprising:

a light emitting junction; and first and second contacts to said light emitting junction having substantially the same nonzero spreading resistance to provide a substantially uniform voltage difference across a predetermined portion of said junction, wherein one of said contacts has a spreading resistance within approximately a range of 1–10 Ω/square of that of the other contact.

35. A method of fabricating a light emitting device, comprising:

forming a light emitting region;

forming a first contact to said light emitting region having a first non-negligible spreading resistance;

forming a second contact, opposing said first contact, to said light emitting region having a second spreading resistance approximately equal to said first spreading resistance; and matching said first and second spreading resistances within a range of approximately 1–10 Ω/square.

36. A method of fabricating a light emitting device, comprising:

forming a light emitting junction;

forming contacts to said junction such that a substantially uniform voltage is applied across said junction by substantially matching spreading resistances of said contacts; and matching said spreading resistances within a range of approximately 1–10 Ω/square.

* * * * *